United States Patent
Cho et al.

(10) Patent No.: US 9,123,725 B2
(45) Date of Patent: Sep. 1, 2015

(54) SEMICONDUCTOR DEVICE HAVING FUSE PATTERN

(71) Applicant: Samsung Electronics Co., Ltd.

(72) Inventors: Moon-Gi Cho, Suwon-si (KR);
Eun-Chul Ahn, Yongin-si (KR);
Sang-Young Kim, Cheonan-si (KR);
Joo-Weon Shin, Suwon-si (KR);
Min-Ho Lee, Cheonan-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 12 days.

(21) Appl. No.: 14/088,654

(22) Filed: Nov. 25, 2013

(65) Prior Publication Data

US 2014/0151845 A1 Jun. 5, 2014

(30) Foreign Application Priority Data

Dec. 4, 2012 (KR) ........................ 10-2012-0139675

(51) Int. Cl.
*H01L 29/80* (2006.01)
*H01L 23/525* (2006.01)
*G06F 12/02* (2006.01)

(52) U.S. Cl.
CPC ........ *H01L 23/5256* (2013.01); *G06F 12/0246* (2013.01); *H01L 2924/0002* (2013.01)

(58) Field of Classification Search
CPC ............ H01L 23/525; H01L 21/76832; H01L 23/5258; H01L 21/76894; H01L 21/76879; H01L 23/5256; H01L 2924/0002; H01L 2924/00; G06F 12/0246
USPC .................................. 257/529–530, 784, 759
See application file for complete search history.

(56) References Cited

U.S. PATENT DOCUMENTS

| | | | |
|---|---|---|---|
| 6,563,188 B2 | 5/2003 | Nagatani | |
| 6,638,795 B2 | 10/2003 | Ikeda et al. | |
| 6,720,591 B2 | 4/2004 | Miyamoto et al. | |
| 7,951,653 B1 | 5/2011 | Park et al. | |
| 2009/0230506 A1* | 9/2009 | Park | 257/529 |
| 2010/0123212 A1* | 5/2010 | Chung et al. | 257/529 |
| 2011/0001212 A1 | 1/2011 | Kim | |
| 2012/0228735 A1* | 9/2012 | Choi | 257/529 |

FOREIGN PATENT DOCUMENTS

| | | |
|---|---|---|
| JP | 10-256373 | 9/1998 |
| JP | 11-087522 | 3/1999 |
| KR | 1994-000919 | 2/1994 |

(Continued)

*Primary Examiner* — Dung Le
(74) *Attorney, Agent, or Firm* — Muir Patent Law, PLLC

(57) ABSTRACT

A semiconductor device has improved reliability by preventing a fuse cut through a repair process from being electrically reconnected by electrochemical migration. The semiconductor device includes a substrate, a fuse including a first fuse pattern and a second fuse pattern formed at the same level on the substrate, the first fuse pattern and the second fuse pattern being spaced a first width apart from each other such that a gap in the fuse is disposed at a first location between the first fuse pattern and the second fuse pattern, and a first insulation layer formed on the first fuse pattern and the second fuse pattern, the first insulation layer including an opening above the first location and having a second width smaller than the first width.

17 Claims, 13 Drawing Sheets

(56) References Cited

FOREIGN PATENT DOCUMENTS

| KR | 2001-059452 | 7/2001 |
| KR | 2002-002770 | 1/2002 |
| KR | 10-2005-0096377 | 10/2005 |
| KR | 10-2007-0014818 | 2/2007 |
| KR | 10-2011-0010399 | 2/2011 |
| KR | 10-2011-0076244 | 7/2011 |
| KR | 10-1062820 | 9/2011 |

* cited by examiner

SEMICONDUCTOR DEVICE HAVING FUSE PATTERN

CROSS-REFERENCE TO RELATED APPLICATION

This application claims priority from Korean Patent Application No. 10-2012-0139679 filed on Dec. 4, 2012 in the Korean Intellectual Property Office, and all the benefits accruing therefrom under 35 U.S.C. 119, the contents of which in its entirety are herein incorporated by reference.

BACKGROUND

The present invention relates to a semiconductor device. In general, a semiconductor device may be manufactured through several procedures performed in a sequence, including a fabrication process, an electrical die sorting (EDS) process, an assembly process and a test process. Among others, the EDS typically includes a pre-laser test in which semiconductor chips are inspected, a repair process in which defective semiconductor chip confirmed in the pre-laser test are replaced with redundancy semiconductor chips, and a post-laser test in which the replaced normal semiconductor chips are inspected.

The repair process is a process of switching a path of an electrical signal by cutting a fuse. In the repair process, a defective cell that does not operate normally is replaced with a redundant cell or a defective circuit is replaced with a normal circuit. The repair process is often comprised of cutting a fuse connected to a defective cell and replacing the defective cell with a redundant normal cell.

SUMMARY

The present disclosure provides a semiconductor device having improved reliability by preventing a fuse cut through a repair process from being electrically reconnected by electrochemical migration.

The above and other objects of the present disclosure will be described in or be apparent from the following description of various embodiments.

According to one embodiment, a semiconductor device includes a substrate, a fuse including first fuse pattern and a second fuse pattern formed at the same level on the substrate, the first fuse pattern and the second fuse pattern being spaced a first width apart from each other such that a gap in the fuse is disposed at a first location between the first fuse pattern and the second fuse pattern, and a first insulation layer formed on the first fuse pattern and the second fuse pattern, the first insulation layer including an opening above the first location and having a second width smaller than the first width.

According to another aspect of the present invention, there is provided a semiconductor device including a substrate, a first fuse pattern and a second fuse pattern formed on the substrate, the first fuse pattern and the second fuse pattern being spaced a first width apart from each other, a first insulation layer formed on the first fuse pattern and the second fuse pattern, the first insulation layer including an opening formed between the first fuse pattern and the second fuse pattern, an insulating material formed between the first fuse pattern and the second fuse pattern, and an air gap formed between the first fuse pattern and the insulating material.

According to still another aspect of the present invention, there is provided a semiconductor device including a substrate, a fuse including a first fuse pattern and a second fuse pattern formed on the substrate, the first fuse pattern and the second fuse pattern being spaced a first width apart from each other, and an insulation layer formed on the first fuse pattern and the second fuse pattern, the insulation layer including an opening formed between the first fuse pattern and the second fuse pattern, wherein at least one of the first fuse pattern and the second fuse pattern is undercut below the insulation layer.

According to another embodiments, a semiconductor device includes a substrate; a first fuse pattern of a fuse and a second fuse pattern of the fuse, formed on the substrate at a same plane, the first fuse pattern and the second fuse pattern being spaced a first width apart from each other; and an insulative pattern formed between and at the same plane as the first fuse pattern and second fuse pattern. The insulative pattern includes at least a first portion formed of a solid material, and at least a second portion that does not permit electrochemical migration of conductive material between the first fuse pattern and the second fuse pattern.

BRIEF DESCRIPTION OF THE DRAWINGS

The above and other features and advantages of the present disclosure will become more apparent by describing in detail various embodiments thereof with reference to the attached drawings in which.

DETAILED DESCRIPTION OF THE EMBODIMENTS

Figure 1:
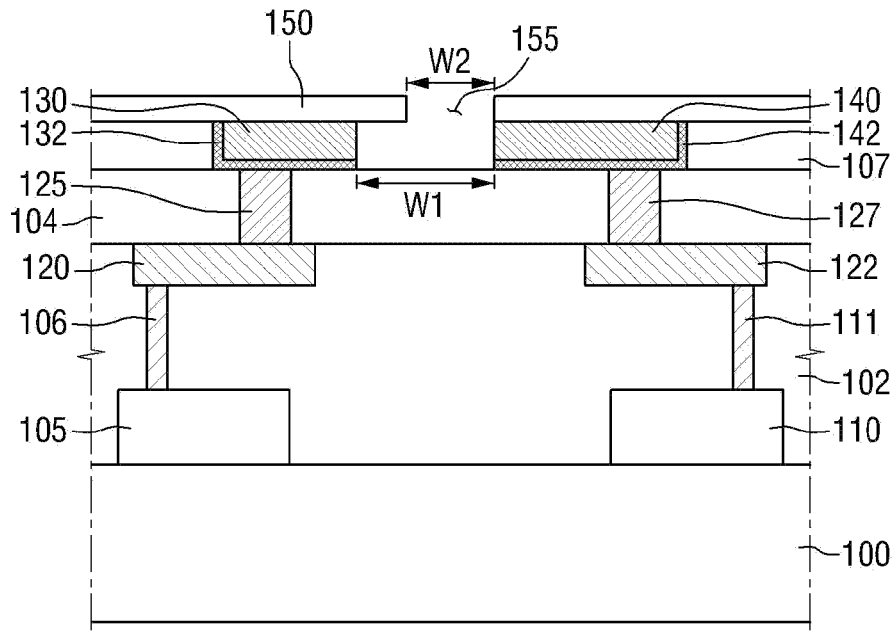
FIG. 1 is a view illustrating a semiconductor device according to a first exemplary embodiment.

The present disclosure will now be described more fully hereinafter with reference to the accompanying drawings, in which various embodiments are shown. This invention may, however, be embodied in different forms and should not be construed as limited to the embodiments set forth herein. The same reference numbers indicate the same or similar components throughout the specification. In the attached figures, the thickness of layers and regions may be exaggerated for clarity.

It will be understood that when an element or layer is referred to as being "connected to," "coupled to," or "on" another element or layer, it can be directly connected to or coupled to or on another element or layer or intervening elements or layers may be present. In contrast, when an element is referred to as being "directly connected to," "directly coupled to," or "on" another element or layer, there are no intervening elements or layers present. Other terms, such as "adjacent" or "between" should be treated in a like manner. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. Unless the context indicates otherwise, these terms are only used to distinguish one element from another element. Thus, for example, a first element, a first component or a first section discussed below could be termed a second element, a second component or a second section without departing from the teachings of the present invention.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless defined otherwise, all technical and scientific terms used herein have the same meaning as commonly understood by one of ordinary skill in the art to which this disclosure belongs. It is noted that the use of any and all examples, or exemplary terms provided herein is intended merely to better illuminate the disclosure and is not a limitation on the scope of the invention unless otherwise specified. Further, unless defined otherwise, all terms defined in generally used dictionaries should not be overly interpreted.

Hereinafter, a semiconductor device according to one exemplary embodiment will be described with reference to FIGS. 1 and 2.

Figure 2:
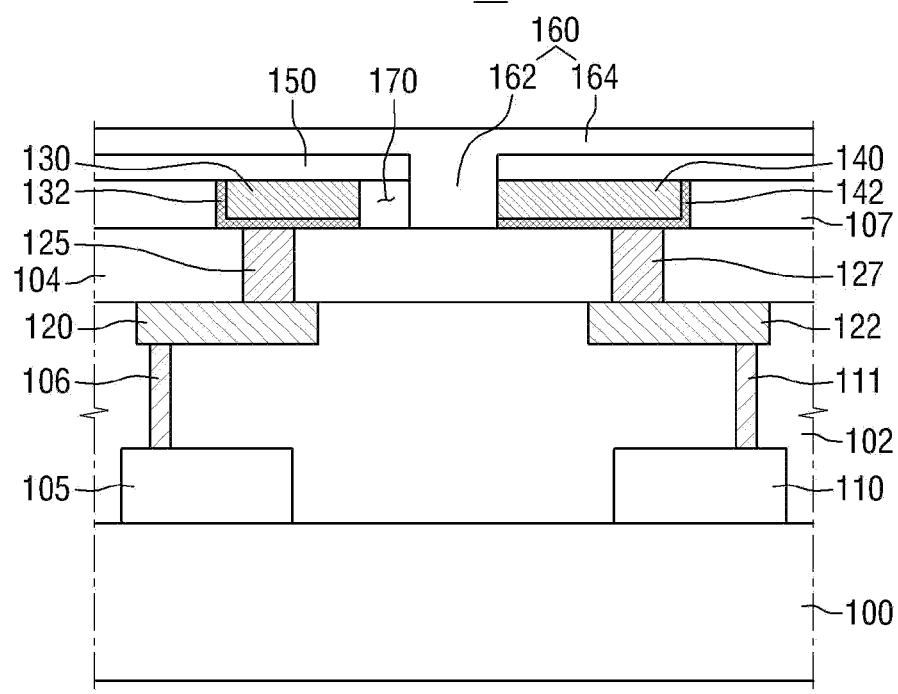
FIG. 2 is a view illustrating the semiconductor device shown in FIG. 1 after being assembled, according to one exemplary embodiment.

FIG. 1 is a view illustrating a semiconductor device according to an exemplary embodiment, and FIG. 2 is an exemplary view illustrating the semiconductor device shown in FIG. 1 after being assembled.

Referring to FIG. 1, a semiconductor device 10 includes a substrate 100, a first fuse pattern 130, a second fuse pattern 140 and a first insulation layer 150.

The substrate 100 may be bulk silicon or a silicon-on-insulator (SOI). Alternatively, the substrate 100 may be a silicon substrate or may include other materials, such as silicon germanium, indium antimonide, lead telluride, indium arsenide, indium phosphide, gallium arsenide or gallium antimonide, but not limited thereto.

A first circuit pattern 105 and a second circuit pattern 110 may be formed on the substrate 100. The first circuit pattern 105 and the second circuit pattern 110 may be formed on, for example, a cell region, but not limited thereto. The first and second circuit patterns 105 and 110 may include a transistor, a diode, a capacitor, etc., respectively. The first and second circuit patterns 105 and 110 may constitute circuit devices. Therefore, the semiconductor device 10 may be a semiconductor chip incorporating a plurality of circuit devices. The circuit devices may include a plurality of memory devices. The memory devices may include, for example, a volatile semiconductor memory device and a nonvolatile semiconductor memory device. The volatile semiconductor memory device may include, for example, DRAM, SRAM, and so on. The nonvolatile semiconductor memory device may include, for example, EPROM, EEPROM, Flash EEPROM, and so on. In one embodiment, the first and second circuit patterns 105 and 110 are formed on the substrate 100, but aspects of the present disclosure are not limited thereto. For example, the first and second circuit patterns 105 and 110 may also be buried in the substrate 100.

The second insulation layer 102 may be formed on the substrate 100 and may cover the first and second circuit patterns 105 and 110. A first metal wiring 120 and a second metal wiring 122 may be formed within the second insulation layer 102. The first metal wiring 120 may be electrically connected to the first circuit pattern 105 through a first connection wiring 106, and the second metal wiring 122 may be electrically connected to the second circuit pattern 110 through a second connection wiring 111. The second insulation layer 102 may include, for example, oxide, nitride, oxynitride, or a low dielectric constant (low-k) material. Examples of the low dielectric constant material may include, for example, FOX, TOSZ, USG, BSG, PSG, BPSG, PRTEOS, FSG, HDP, PEOX, FCVD, and combinations thereof. The first metal wiring 120 and the second metal wiring 122 may include, for example, a metal, such as aluminum (Al).

A third insulation layer 104 may be formed on the first metal wiring 120 and the second metal wiring 122. The third insulation layer 104 may include, for example, oxide, nitride, oxynitride, or a low-k material.

The first fuse pattern 130 and the second fuse pattern 140 may be formed on the third insulation layer 104. The first fuse pattern 130 and second fuse pattern 140 may be part of a fuse. For example, the first fuse pattern 130 and second fuse pattern 140 may form a cut fuse, which may also be described as a repair fuse. The first fuse pattern 130 and the second fuse pattern 140 may be formed in a fourth insulation layer 107 formed on the third insulation layer 104. The third insulation layer 104 and the fourth insulation layer 107 may be formed at the same level. The first fuse pattern 130 and the second fuse pattern 140 may be spaced apart from each other. For example, in one embodiment, the first fuse pattern 130 and the second fuse pattern 140 are spaced a first width w1 apart from each other. For example, the different fuse patterns 130 and 140 may have originally been part of a conductive line extending in a lengthwise direction, wherein a part of the line was cut to form the two different fuse patterns (see, for example, FIG. 4. The first fuse pattern 130 and the second fuse pattern 140 may include, for example, at least one of aluminum (Al) and copper (Cu), but aspects of the present disclosure are not limited thereto. The first fuse pattern 130 and the second fuse pattern 140 may be formed at the same level within the semiconductor device 10. For layers formed at the level, a layer (or a component) formed on a predetermined region and a layer (or a component) formed on another region may be formed by the same fabricating process. The fourth insulation layer 107 may include, for example, oxide, nitride, oxynitride, or a low-k material.

A first metal wiring 120 and a second metal wiring 122 may be positioned below the first fuse pattern 130 and the second fuse pattern 140. The first fuse pattern 130 may be electrically connected to the first metal wiring 120 through a first via 125, and the second fuse pattern 140 may be electrically connected to the second metal wiring 122 through a second via 127. Therefore, the first fuse pattern 130 and the second fuse pattern 140 may be electrically connected to the first circuit pattern 105 and the second circuit pattern 110, respectively. The first via 125 and the second via 127 may be formed in the third insulation layer 104 while passing through the third insulation layer 104. The first via 125 and the second via 127 may include, for example, at least one of aluminum (Al), copper (Cu) and tungsten (W). A barrier metal (not shown) may be interposed between each of the first via 125 and the second via 127 and the third insulation layer 104, but aspects of the present disclosure are not limited thereto.

A first barrier metal layer 132 and a second barrier metal layer 142 may further be formed between the third insulation layer 104 and the first fuse pattern 130 and between the third insulation layer 104 and the second fuse pattern 140, respectively. The first barrier metal layer 132 and the second barrier metal layer 142 may be formed in contact with the first fuse pattern 130 and the second fuse pattern 140, respectively. The first barrier metal layer 132 and the second barrier metal layer 142 may prevent the respective materials included in the first fuse pattern 130 and the second fuse pattern 140 from being diffused into the third insulation layer 104. The first barrier metal layer 132 and the second barrier metal layer 142 may be formed at the same level, and may include, for example, Ta, TaN, Ti, TiN, Ru, Co, Ni, NiB, and WN.

The first insulation layer 150 may be formed on the first fuse pattern 130 and the second fuse pattern 140. The first insulation layer 150 may include an opening 155. The opening 155 formed in the first insulation layer 150 may have a second width w2. The first insulation layer 150 may include, for example, oxide, nitride, or oxynitride, but aspects of the present disclosure are not limited thereto.

The opening 155 may be formed between the first fuse pattern 130 and the second fuse pattern 140. In one embodiment, the second width w2 of the opening 155 is smaller than the first width w1, such that the width of the opening 155 is smaller than the gap between the first fuse pattern 130 and the second fuse pattern 140. Since the gap between the first fuse pattern 130 and the second fuse pattern 140 is greater than the width of the opening 155, the opening 155 may not overlap at least one of the first fuse pattern 130 and the second fuse pattern 140. As such, at least one of the first fuse pattern 130 and the second fuse pattern 140 may be undercut below the first insulation layer 150. An undercut region formed below the first insulation layer 150 may be formed by, for example, wet etching, dry etching, or a combination thereof. Described in a different way, the first insulation 150 may overhang the first fuse pattern 130 and/or the second fuse pattern 140. In one embodiment, as depicted in FIG. 1, the opening 155 does not overlap the first fuse pattern 130, and lateral surfaces of the second fuse pattern 140 and a first insulating layer 130 that defines the opening 155 are coplanar.

FIG. 2 illustrates an adhesive for facilitating adhesion to another semiconductor device is formed on the first insulation layer 150 to assemble the semiconductor device 10 shown in FIG. 1. For example, FIG. 1 illustrates that a fuse is repaired before the semiconductor device 10 is assembled, and FIG. 2 illustrates a state of the semiconductor device 10 including a repaired fuse after it is assembled with another semiconductor device.

Referring to FIG. 2, the semiconductor device 10 may further include an insulating material 160. At least a portion of the insulating material 160 may be formed between the first fuse pattern 130 and the second fuse pattern 140. Since the insulating material 160 is formed between the first fuse pattern 130 and the second fuse pattern 140, an air gap 170 may be formed between the first fuse pattern 130 and the insulating material 160 and/or between the second fuse pattern 140 and the insulating material 160.

In detail, the insulating material 160 may include a first portion 162 and a second portion 164. The first portion 162 of the insulating material 160 may pass through the opening 155 to extend up to the third insulation layer 104 and may be formed between the first fuse pattern 130 and the second fuse pattern 140. The second portion 164 of the insulating material 160 may be connected to the first portion 162 of the insulating material 160 and may be formed on the first insulation layer 150. The insulating material 160 may include, for example, a die attach film (DAF) or an epoxy molding compound (EMC), but aspects of the present invention are not limited thereto.

In one embodiment, the insulating material 160 is spatially separated from the first fuse pattern 130, and is formed in contact with the second fuse pattern 140. As such, the first portion 162 of the insulating material 160 may be positioned between the first fuse pattern 130 and the second fuse pattern 140 while making contact with the second fuse pattern 140. Since the insulating material 160 is spatially separated from the first fuse pattern 130, a first air gap 170 is formed between the first portion 162 of the insulating material 160 and the first fuse pattern 130. However, since the first portion 162 of the insulating material 160 and the second fuse pattern 140 make contact with each other, an air gap is not formed between the first portion 162 of the insulating material 160 and the second fuse pattern 140. As a result, an insulative pattern is formed on the same plane as the fuse patterns 130 and 140 and between the fuse patterns 130 and 140. The insulative pattern may include, as described above, an air portion and a solid portion (e.g., insulating material 162). At least the air portion may prevent electrochemical migration of material from the first fuse pattern 130 to the second fuse pattern 140. The insulative pattern may include additional portions, such as an additional air portion, as described in more detail in connection with the embodiments discussed below.

FIG. 2 illustrates that a conductive material is not included in the first portion 162 of the insulating material 160, but aspects of the present disclosure are not limited thereto. The insulating material 160 may be a porous material. Thus, the material included in the second fuse pattern 140 may be diffused into the insulating material 160 by electrochemical migration when the semiconductor device 10 is exposed to high-temperature and high-humidity conditions. As described above, when the second fuse pattern 140 is diffused into the insulating material 160, a line-shaped conductive band may be formed in the first portion 162 of the insulating material 160.

However, since the first air gap 170 is formed between the first portion 162 of the insulating material 160 and the first fuse pattern 130, the conductive material included in the first portion 162 of the insulating material 160 is not connected to the first fuse pattern 130. The first air gap 170 is formed between the first portion 162 of the insulating material 160 and the first fuse pattern 130, thereby electrically insulating the first fuse pattern 130 and the second fuse pattern 140 and physically preventing a conductive band such as described above from being formed. Therefore, since the first fuse pattern 130 and the second fuse pattern 140 are electrically insulated by the first air gap 170, the reliability of a semiconductor package manufactured using the semiconductor device 10 can be improved.

In describing the embodiments of FIGS. 1 and 2, the insulating material 160 is not depicted as being inserted into the undercut region of the first fuse pattern 130 formed below the first insulation layer 150. However, aspects of the present disclosure are not limited thereto. For example, a portion of the insulating material 160 may be inserted into the undercut region of the first fuse pattern 130 formed below the first insulation layer 150. However, even if the portion of the insulating material 160 is inserted into the undercut region of the first fuse pattern 130 formed below the first insulation layer 150, on certain embodiments, the first air gap 170 is formed between the insulating material 160 and the first fuse pattern 130.

Hereinafter, a semiconductor device according to another embodiment will be described with reference to FIGS. 3 to 6. This embodiment is substantially the same as the previous embodiment, except that a second fuse pattern may be additionally undercut. Thus, the same functional components as those of the first embodiment are denoted by the same reference numerals and repeated explanations thereof will be briefly given or will not be given.

Figure 3:
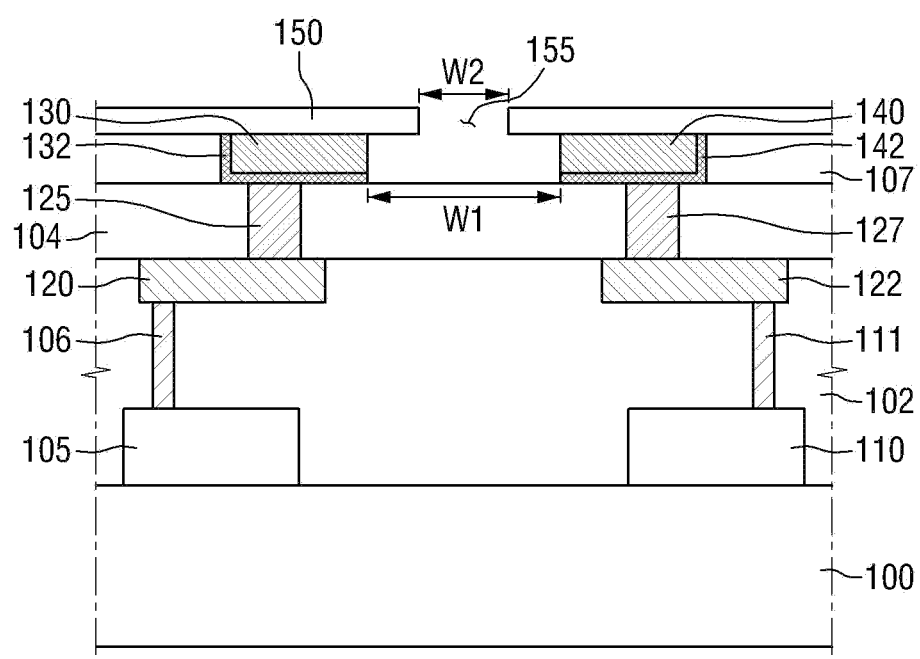
FIG. 3 is a view illustrating a semiconductor device according to an additional exemplary embodiment.
Figure 4:
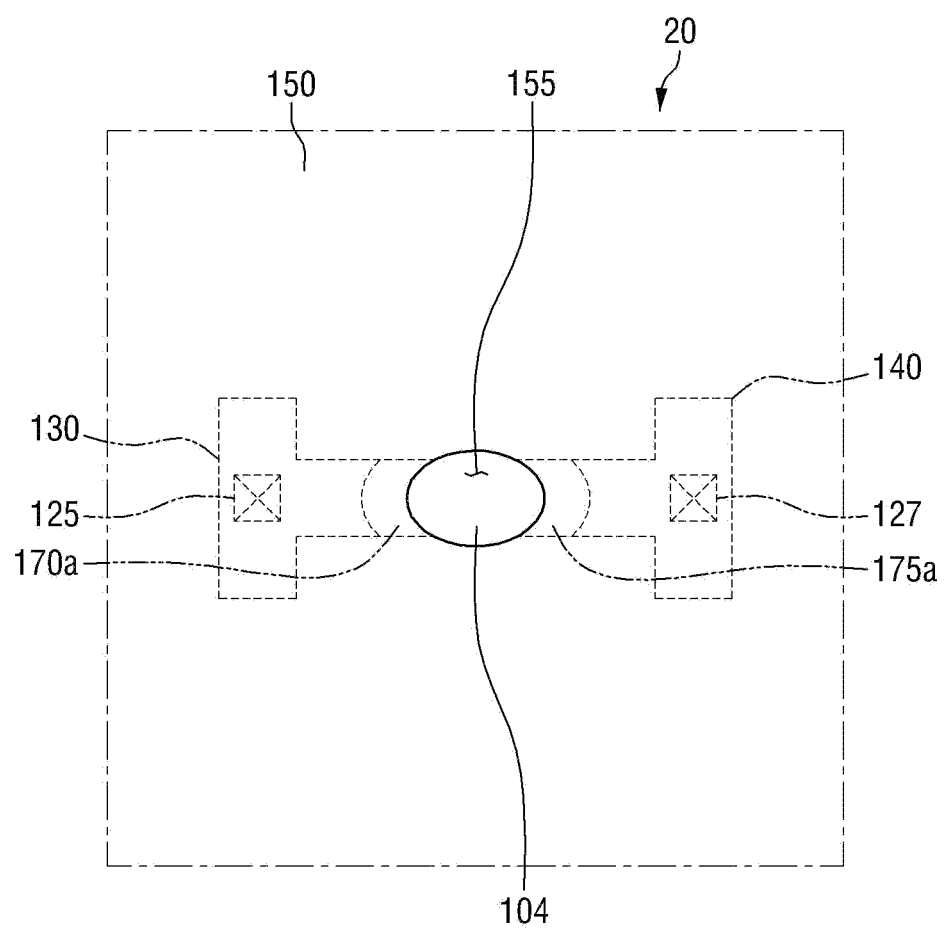
FIG. 4 is a plan view of FIG. 3, according to one exemplary embodiment.
Figure 5:
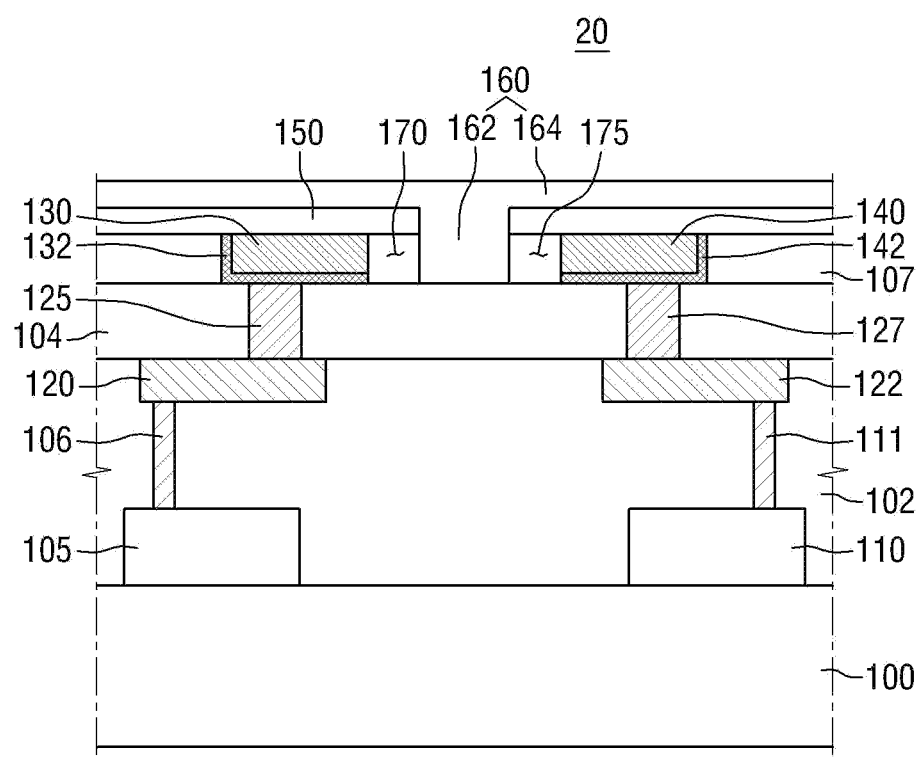
FIG. 5 is a view illustrating the semiconductor device shown in FIG. 3 after being assembled, according to one exemplary embodiment.
Figure 6:
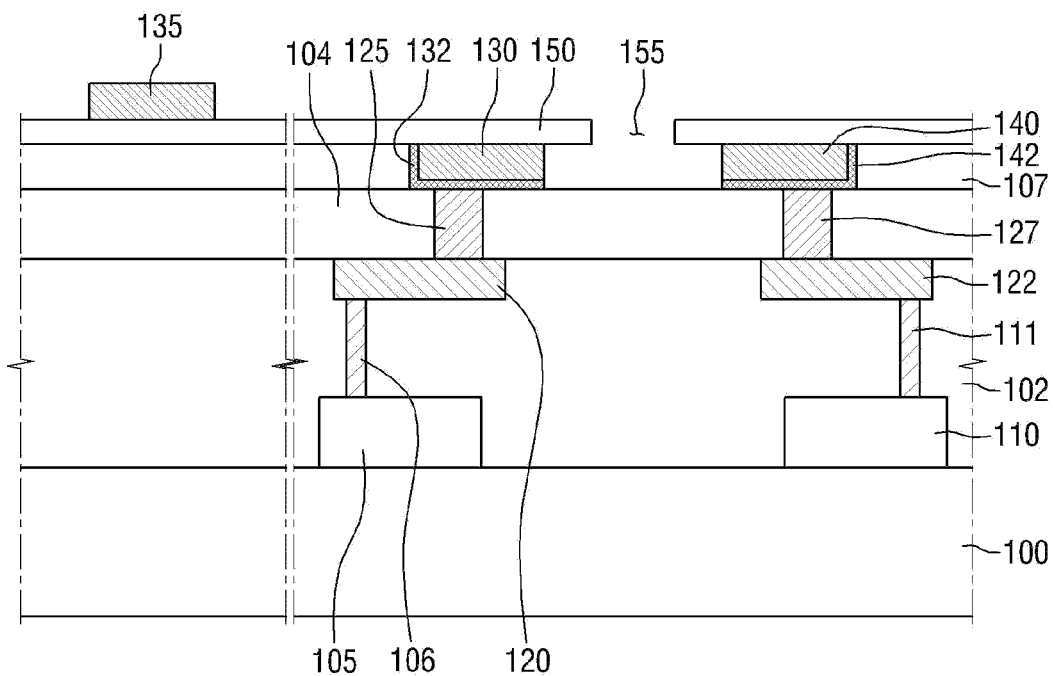
FIG. 6 is a view illustrating the semiconductor device shown in FIG. 3, further comprising a pad, according to one exemplary embodiment.

FIG. 3 is a view illustrating a semiconductor device according to a second embodiment of the present invention, FIG. 4 is a plan view of FIG. 3, FIG. 5 is a view illustrating the semiconductor device shown in FIG. 3 after being assembled, and FIG. 6 is a view illustrating the semiconductor device shown in FIG. 3, further comprising a pad.

Referring to FIG. 3, an exemplary semiconductor device 20 includes a substrate 100, a first fuse pattern 130, a second fuse pattern 140 and a first insulation layer 150.

The first circuit pattern 105 and the second circuit pattern 110 are formed on the substrate 100.

A first metal wiring 120 and a second metal wiring 122 electrically connected to the first circuit pattern 105 and the second circuit pattern 110 are formed on the first circuit pattern 105 and the second circuit pattern 110, respectively. The first metal wiring 120 and the second metal wiring 122 may be formed within the second insulation layer 102 formed on the substrate 100. The first fuse pattern 130 and the second fuse pattern 140 are formed on the first metal wiring 120 and the second metal wiring 122. The first fuse pattern 130 and the second fuse pattern 140 are electrically connected to the first metal wiring 120 and the second metal wiring 122, respectively.

A first via 125 is formed between the first fuse pattern 130 and the first metal wiring 120, and a second via 127 is formed between the second fuse pattern 140 and the second metal wiring 122. The first via 125 and the second via 127 may be formed in the third insulation layer 104 interposed between each of the first fuse pattern 130 and the second fuse pattern 140 and the second insulation layer 102.

The first insulation layer 150 is formed on the first fuse pattern 130 and the second fuse pattern 140, and includes an opening 155 formed between the first fuse pattern 130 and the second fuse pattern 140.

When the first fuse pattern 130 and the second fuse pattern 140 are spaced the first width w1 apart from each other, the second width w2 of the opening 155 is smaller than the first width w1. As shown in FIG. 5, the gap between the first fuse pattern 130 and the second fuse pattern 140 is greater than the width of the opening 155, and the opening 155 overlaps both the first fuse pattern 130 and the second fuse pattern 140. As such, the first fuse pattern 130 and the second fuse pattern 140 are undercut below the first insulation layer 150.

Accordingly, opening 155 does not overlap the first fuse pattern 130 or the second fuse pattern 140. As a result, in the semiconductor device according to the embodiment of FIG. 2, the first insulation layer 150 overhangs both the first fuse pattern 130 and the second fuse pattern 140.

FIGS. 1 and 2 depict the first fuse pattern 130 and the second fuse pattern 140 below the first insulation layer 150 having the same width, but aspects of the present disclosure are not limited thereto. For example, the width of the first fuse pattern 130 below the first insulation layer 150 may be different from the width of the second fuse pattern 140 below the first insulation layer 150.

Referring to FIG. 4, the opening 155 is formed in the first insulation layer 150. The third insulation layer 104 positioned below the first insulation layer 150 may be exposed by the opening 155. A pair of the first fuse pattern 130 and the second fuse pattern 140 may be positioned below the first insulation layer 150. Neither the first fuse pattern 130 nor the second fuse pattern 140 overlap the opening 155. Each fuse pattern 130 and 140 may be recessed from an edge of the opening 155. An undercut region 170a of the first fuse pattern 130 (e.g., region where the first fuse pattern 130 is missing) is positioned between the opening 155 and the first fuse pattern 130, and an undercut region 175a of the second fuse pattern 140 (e.g., region where the second fuse pattern 140 is missing) is positioned between the opening 155 and the second fuse pattern 140. The two undercut regions may correspond to a cut portion of a fuse that lies beneath the first insulation layer 150.

For the sake of convenient explanation, the pair of the first fuse pattern 130 and the second fuse pattern 140 are shown in the illustrated embodiment, but aspects of the present invention are not limited thereto. In addition, for the sake of convenient explanation, the first fuse pattern 130 and the second fuse pattern 140 are aligned in one direction, but aspects of the present invention are not limited thereto.

For the sake of convenient explanation, a fuse that has yet to be repaired (e.g., an unbroken fuse) is exemplified as a dog-bone shaped fuse in the illustrated embodiment, but aspects of the present invention are not limited thereto. For example, the fuse that has yet to be repaired may have a linear shape or another shape different from the dog-bone shape or the linear shape.

Referring to FIG. 5, the semiconductor device 20 may further include an insulating material 160. The insulating material 160 includes a first portion 162 and a second portion 164. The first portion 162 of the insulating material 160 passes through the opening 155 and is formed between the first fuse pattern 130 and the second fuse pattern 140, and the second portion 164 of the insulating material 160 may be formed on the first insulation layer 150. Since the insulating material 160 is formed between the first fuse pattern 130 and the second fuse pattern 140, air gaps 170 and 175 may be formed between the first fuse pattern 130 and the insulating material 160 and/or between the second fuse pattern 140 and the insulating material 160.

In FIG. 5, the first air gap 170 is formed between the first fuse pattern 130 and the insulating material 160, and the second air gap 175 is formed between the second fuse pattern 140 and the insulating material 160. However, if the width of the first fuse pattern 130 undercut below the first insulation layer 150 and that of the second fuse pattern 140 undercut below the first insulation layer 150 are different from each other, and the portion of the insulating material 160 is inserted into the undercut portion of the first fuse pattern 130 or the second fuse pattern 140, only one of the first air gap 170 and the second air gap 175 may be formed, or if both air gaps are still formed, the first air gap 170 and second air gap 175 may have different widths.

In detail, the first portion 162 of the insulating material 160 is spatially separated from the first fuse pattern 130 and the second fuse pattern 140. As a result, the first air gap 170 is formed between the first fuse pattern 130 and the first portion 162 of the insulating material 160, and the second air gap 175 is formed between the second fuse pattern 140 and the first portion 162 of the insulating material 160. The first air gap 170 is surrounded by the first fuse pattern 130, the first insulation layer 150, the insulating material 160, the third insulation layer 104 and the fourth insulation layer 107, and the second air gap 175 is surrounded by the second fuse pattern 140, the first insulation layer 150, the insulating material 160, the third insulation layer 104 and the fourth insulation layer 107.

The first air gap 170 and the second air gap 175 are formed between the first fuse pattern 130 and the second fuse pattern 140, and the first fuse pattern 130 and the second fuse pattern 140 may be electrically and electrochemically insulated. Therefore, even when the semiconductor device 20 is exposed to high-temperature and high-humidity conditions, since the first air gap 170 and the second air gap 175 are formed between the first fuse pattern 130 and the second fuse pattern 140, the first fuse pattern 130 and the second fuse pattern 140 remain electrically separated due to the air gaps' prevention of electrochemical migration of conductive material from the first fuse pattern 130 to the second fuse pattern 140.

Referring to FIG. 6, a pad 135 for transferring electrical signals to the first circuit pattern 105, the second circuit pattern 110, the first metal wiring and the second metal wiring 122 may be formed on the first insulation layer 150 positioned on the substrate of a cell region and a peripheral circuit region. The pad 135 may be formed using a conductive material such as a metal, conductive metal nitride or metal silicide. For example, the pad 135 may be formed of a metal having low specific resistance, such as aluminum (Al) or tungsten (W). The pad 135 may not be formed immediately above the first fuse pattern 130 and the second fuse pattern 140. In detail, the pad 135 is not formed immediately above the opening 155, and may be horizontally separate from the opening 155.

In describing the semiconductor devices according to various embodiments, the opening 155 may be an open region of the semiconductor device 20, and a conductive pattern is not formed immediately above the opening 155.

Figure 7:
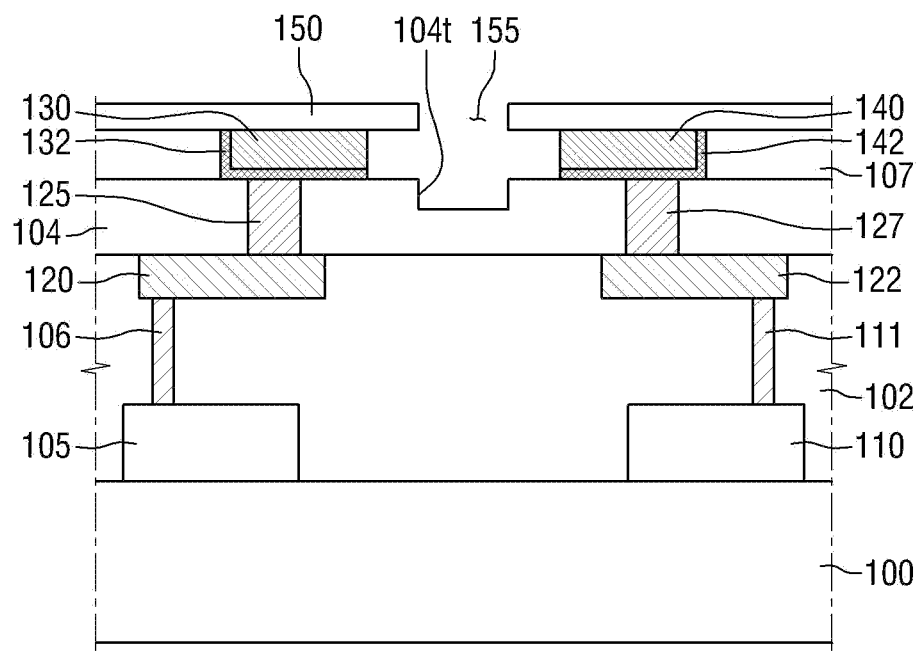
FIG. 7 is a view illustrating a semiconductor device according to another exemplary embodiment.
Figure 8:
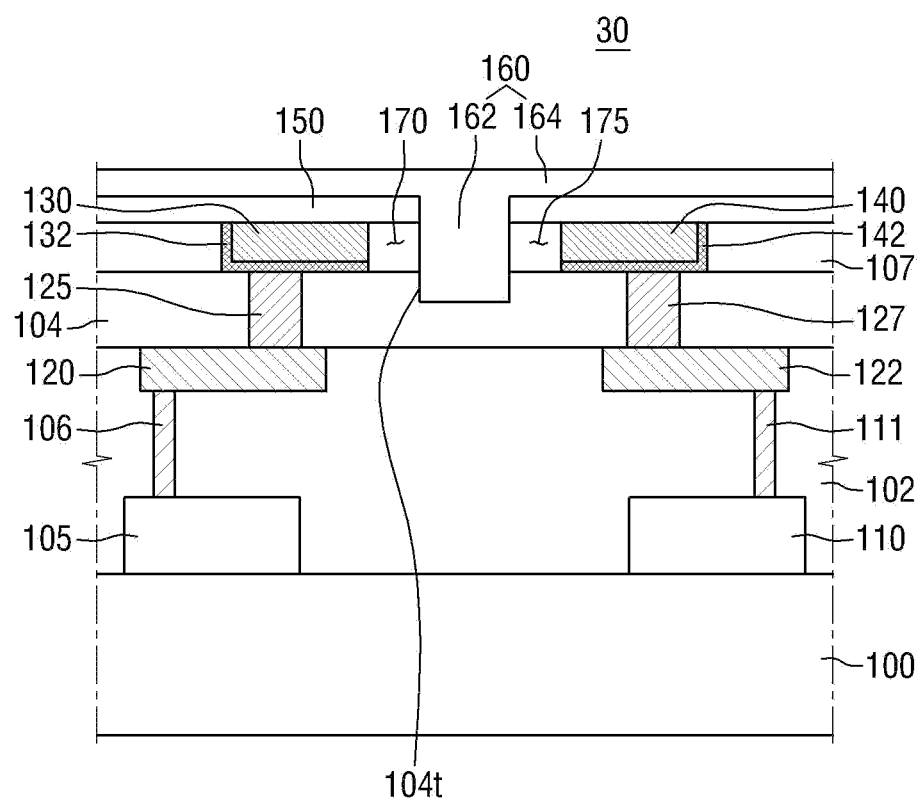
FIG. 8 is a view illustrating the semiconductor device shown in FIG. 7 after being assembled, according to one exemplary embodiment.

A semiconductor device according to an additional embodiment will be described with reference to FIGS. 7 and 8. The embodiment shown in FIGS. 7 and 8 is substantially the same as the previous embodiment, except that a third insulation layer includes a trench. Thus, the same functional components as those of the previous embodiment are denoted by the same reference numerals and repeated explanations thereof will be briefly given or will not be given.

FIG. 7 is a view illustrating a semiconductor device according to a third exemplary embodiment of the present disclosure and FIG. 8 is a view illustrating the semiconductor device shown in FIG. 7 after being assembled.

Referring to FIG. 7, a semiconductor device 30 includes a first fuse pattern 130, a second fuse pattern 140, a trench 104*t* and a first insulation layer 150.

The first fuse pattern 130 electrically connected to a first circuit pattern 105, and the second fuse pattern 140 electrically connected to a second circuit pattern 110, are formed on a third insulation layer 104. The first insulation layer 150 including an opening 155 is formed on the first fuse pattern 130 and the second fuse pattern 140. The opening 155 is formed between the first fuse pattern 130 and the second fuse pattern 140 and does not overlap at least one of the first fuse pattern 130 and the second fuse pattern 140. Therefore, the first insulation layer 150 overhangs at least one of the first fuse pattern 130 and the second fuse pattern 140.

The third insulation layer 104 positioned under the first fuse pattern 130 and the second fuse pattern 140 includes the trench 104*t*. The trench 104*t* is formed within the third insulation layer 104. At least a portion of the trench 104*t* may overlap the opening 155 included in the first insulation layer 150. In addition, the trench 104*t* may be formed between the first fuse pattern 130 and the second fuse pattern 140 and in one embodiment, does not overlap the first fuse pattern 130 or the second fuse pattern 140. As such, in the embodiment shown in FIG. 7, the first fuse pattern 130 and the second fuse pattern 140 do not protrude above the trench 104*t*. In one embodiment, a gap between the first fuse pattern 130 and the second fuse pattern 140 is equal to a width of the trench 104*t*.

In one embodiment, as shown in FIG. 7, the width of the trench 104*t* and the width of the opening 155 are equal to each other, and the trench 104*t* entirely overlaps the opening 155, but aspects of the present invention are not limited thereto. The trench 104*t* is provided for the purpose of more definitely ensuring spatial and electrical separation between the first fuse pattern 130 and the second fuse pattern 140, and width of the trench 104*t* may vary. In addition, in the manufacture of the semiconductor device 30 according to the embodiment depicted in FIG. 7, since the trench 104*t* may be formed using the opening 155 as a window, it may entirely overlap the opening 155. However, an overlapping extent of the trench 104t and the opening 155 may vary.

Referring to FIG. 8, the semiconductor device 30 may further include an insulating material 160 having a first portion 162 and a second portion 164. The first portion 162 of the insulating material 160 may pass through the opening 155 and may extend up to the inside of the trench 104t formed between the first fuse pattern 130 and the second fuse pattern 140. The insulating material 160 may fill the trench 104t formed in the third insulation layer 104.

A first air gap 170 is formed between the first fuse pattern 130 and the first portion 162 of the insulating material 160, and a second air gap 175 is formed between the second fuse pattern 140 and the first portion 162 of the insulating material 160. The air gap 170 and the second air gap 175 may be positioned farther from the substrate 100 than the bottom surface of the trench 104t is from the substrate. If the width of the trench 104t is greater than that of the opening 155, a portion of at least one of the first air gap 170 and the second air gap 175 may be formed in the third insulation layer 104.

A semiconductor device according to a further embodiment is be described with reference to FIGS. 9 and 10. This embodiment is substantially the same as the embodiment shown in FIG. 3, except that the illustrated semiconductor device includes a conductive particle. Thus, the same functional components as those of the embodiment of FIG. 3 are denoted by the same reference numerals and repeated explanations thereof will be briefly given or will not be given.

Figure 9:
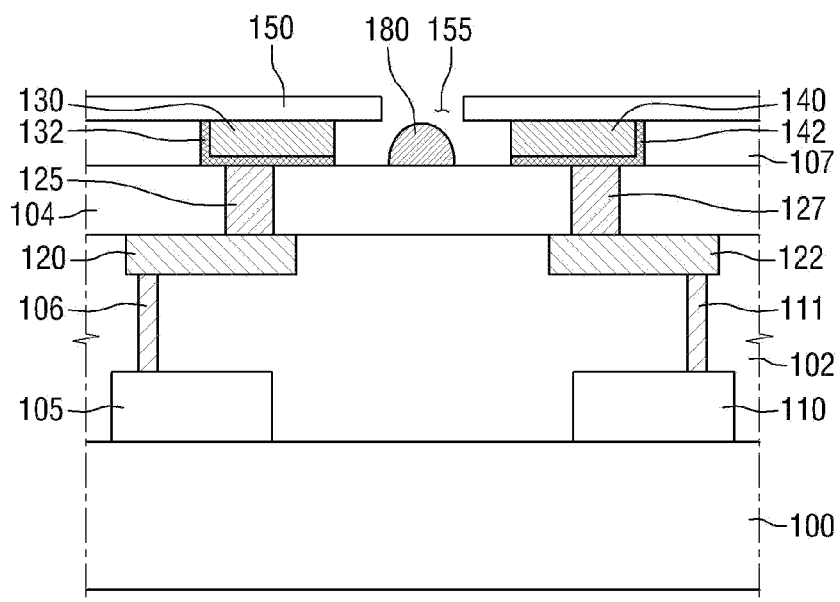
FIG. 9 is a view illustrating a semiconductor device according to a further exemplary embodiment.
Figure 10:
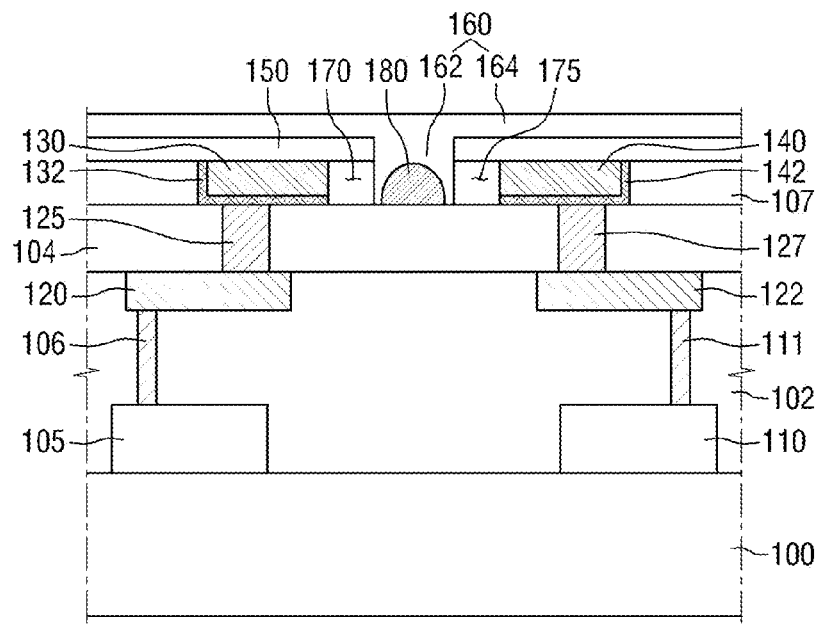
FIG. 10 is a view illustrating the semiconductor device shown in FIG. 9 after being assembled, according to one exemplary embodiment.

FIG. 9 is a view illustrating an exemplary semiconductor device and FIG. 10 is a view illustrating the semiconductor device shown in FIG. 9 after being assembled.

Referring to FIG. 9, a semiconductor device 40 includes a first fuse pattern 130, a second fuse pattern 140, a conductive particle 180 and a first insulation layer 150.

The first fuse pattern 130 and the second fuse pattern 140 electrically connected to the first circuit pattern 105 and the second circuit pattern 110 are formed on the third insulation layer 104. The first insulation layer 150 including an opening 155 is formed on the first fuse pattern 130 and the second fuse pattern 140. The opening 155 is formed between the first fuse pattern 130 and the second fuse pattern 140. At least one of the first fuse pattern 130 and the second fuse pattern 140 is undercut below the first insulation layer 150.

The conductive particle 180 is formed between the first fuse pattern 130 and the second fuse pattern 140. The conductive particle 180 is formed on the third insulation layer 104. In detail, the conductive particle 180 may be formed in contact with the third insulation layer 104. The conductive particle 180 may entirely overlap the opening 155. In the illustrated embodiment, the conductive particle 180 is spatially spaced apart from the first fuse pattern 130 and the second fuse pattern 140, but aspects of the present invention are not limited thereto. For example, the conductive particle 180 may be connected to one of the first fuse pattern 130 and the second fuse pattern 140. In the case of FIGS. 9 and 10, the fuse pattern is not connected to the conductive particle 180 and is undercut below the first insulation layer 150. The fuse pattern is spatially spaced apart from the conductive particle 180.

The conductive particle 180 may be an externally applied metallic material. In addition, the conductive particle 180 may include, for example, materials included in the fuse patterns 130 and 140, or materials included in barrier metal layers 132 and 142. For example, the conductive particle 180 may be a residue produced when the first fuse pattern 130 and the second fuse pattern 140 are formed by repairing (e.g., cutting) a fuse connecting the first circuit pattern 105 and the second circuit pattern 110.

In describing the semiconductor device 40 according to the embodiment shown in FIGS. 9 and 10, the conductive particle 180 does not protrude from a top surface of the first insulation layer 150, but aspects of the present invention are not limited thereto. For example, a portion of the conductive particle 180 may protrude from the top surface of the first insulation layer 150.

Referring to FIG. 10, the semiconductor device 40 may further include an insulating material 160 having a first portion 162 and a second portion 164. The first portion 162 of the insulating material 160 formed between the first fuse pattern 130 and the second fuse pattern 140 while passing through an opening 155, may surround the conductive particle 180. The first air gap 170 is formed between the first fuse pattern 130 and the first portion 162 of the insulating material 160, and the second air gap 175 is formed between the second fuse pattern 140 and the first portion 162 of the insulating material 160 by the insulating material 160 surrounding the conductive particle 180. As such, the first air gap 170 may be formed between the first fuse pattern 130 and the conductive particle 180, and the second air gap 175 may be formed between the second fuse pattern 140 and the conductive particle 180.

In describing the semiconductor device 40 according to the embodiment of FIGS. 9 and 10, the conductive particle 180 is completely surrounded by the insulating material 160. However, aspects of the present disclosure are not limited thereto. For example, a portion of the conductive particle 180 may be exposed by the insulating material 160. Even if the conductive particle 180 is exposed to the outside of the insulating material 160, the first and second air gaps 170 and 175 are formed between the conductive particle 180 and each of the first and second fuse patterns 130 and 140.

As shown in FIGS. 9 and 10, the first air gap 170 and the second air gap 175 are formed on both side surfaces of the conductive particle 180. However, aspects of the present disclosure are not limited thereto. For example, when one of the first fuse pattern 130 and the second fuse pattern 140 is undercut below the first insulation layer 150, only one of the first air gap 170 and the second air gap 175 may be formed. Alternatively, the first fuse pattern 130 and the second fuse pattern 140 may both be undercut below the first insulation layer 150. In this case, if the portion of insulating material 160 is inserted into the undercut region and makes contact with one of the first fuse pattern 130 and the second fuse pattern 140, only one of the first air gap 170 and the second air gap 175 may be formed. As a result, the semiconductor device 40 may include the first and second air gaps 170 and 175 formed between the first fuse pattern 130 and the conductive particle 180 and/or between the second fuse pattern 140 and the conductive particle 180.

A semiconductor device according to another embodiment is be described with reference to FIGS. 11 and 12. This is substantially the same as the embodiment shown in FIG. 3, except that the illustrated semiconductor device includes a spacer. Thus, the same functional components as those of the embodiment shown in FIG. 3 are denoted by the same reference numerals and repeated explanations thereof will be briefly given or will not be given.

Figure 11:
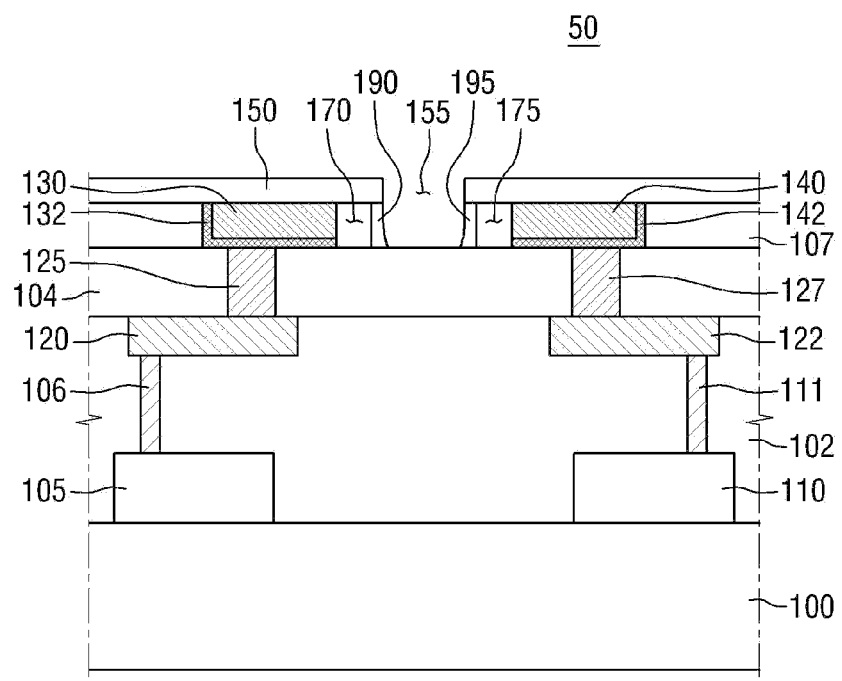
FIG. 11 is a view illustrating a semiconductor device according to another exemplary embodiment.
Figure 12:
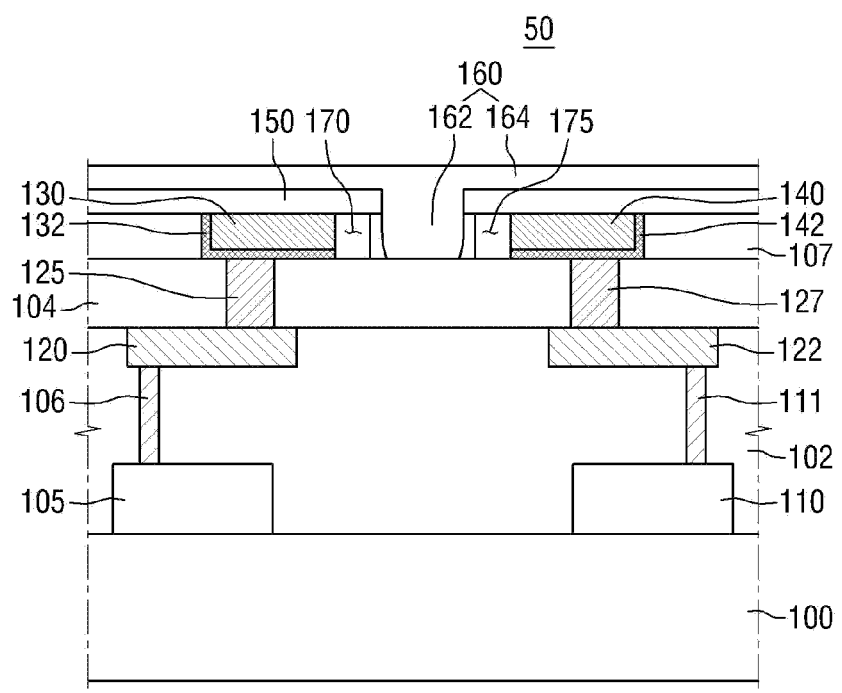
FIG. 12 is a view illustrating the semiconductor device shown in FIG. 11 after being assembled, according to one exemplary embodiment.

FIG. 11 is a view illustrating an exemplary semiconductor device and FIG. 12 is a view illustrating the semiconductor device shown in FIG. 11 after being assembled.

Referring to FIG. 11, a semiconductor device 50 includes a first fuse pattern 130, a second fuse pattern 140, a first spacer 190, a second spacer 195 and a first insulation layer 150.

The first fuse pattern 130 and the second fuse pattern 140 electrically connected to a first circuit pattern 105 and a second circuit pattern 110, respectively, are formed on a third insulation layer 104. The first insulation layer 150 including an opening 155 is formed on the first fuse pattern 130 and the second fuse pattern 140. The opening 155 is formed between the first fuse pattern 130 and the second fuse pattern 140. At least one of the first fuse pattern 130 and the second fuse pattern 140 is undercut below the first insulation layer 150.

A first spacer 190 is formed between the first fuse pattern 130 and the opening 155, and a second spacer 195 is formed between the second fuse pattern 140 and the opening 155. In an embodiment when only one of the first fuse pattern 130 and the second fuse pattern 140 is undercut, only one of the first spacer 190 and the second spacer 195 may be formed. The first spacer 190 may be disposed in a space formed when the first fuse pattern 130 is undercut below the first insulation layer 150, and the second spacer 195 may be disposed in a space formed when the second fuse pattern 140 is undercut below the first insulation layer 150. As shown, first spacer 190 and the second spacer 195 may be formed between the third insulation layer 104 and the first insulation layer 150.

As the result of forming the first spacer 190, a first air gap 170 may be formed between the first spacer 190 and the first fuse pattern 130, and a second air gap 175 may be formed between the second spacer 195 and the second fuse pattern 140.

As shown in FIG. 11 the first air gap 170 and the second air gap 175 are formed, but aspects of the present disclosure are not limited thereto. When the first fuse pattern 130 and the second fuse pattern 140 are undercut below the first insulation layer 150 to different extents, one of the first and second fuse patterns 130 and 140 may make contact with one of the first and second spacers 190 and 195. Here, air gaps are formed between each of the fuse patterns not in contact with each other and each of the first and second spacers 190 and 195. Therefore, the semiconductor device 50, including the first spacer 190 and the second spacer 195, may include only one of the first air gap 170 and the second air gap 175 formed below the first insulation layer 150, or may include both.

The first spacer 190 and the second spacer 195 may include, for example, an insulating material. In detail, first spacer 190 and the second spacer 195 may include photosensitive polyimide (PSPI), polyimide (PI), photosensitive polyhydroxystyrene, and so on, but aspects of the present disclosure are not limited thereto. In the manufacture of the semiconductor device 50 according to the embodiment shown in FIG. 11, since the first spacer 190 and the second spacer 195 are formed after the undercut region is formed below the first insulation layer 150, the first spacer 190 and the second spacer 195 may be formed by hardening a flowable insulating material.

Referring to FIG. 12, the semiconductor device 50 may further include an insulating material 160 having a first portion 162 and a second portion 164. The first portion 162 of the insulating material 160 may pass through the opening 155 to be formed between the first spacer 190 and the second spacer 195. The first spacer 190 and the second spacer 195 are formed in contact with the insulating material 160.

As illustrated in FIG. 12, the first spacer 190 may be formed between the first fuse pattern 130 and the insulating material 160, and the second spacer 195 may be formed between the second fuse pattern 140 and the insulating material 160. Since at least one of the first spacer 190 and the second spacer 195 is formed, the spacers may be formed between the first fuse pattern 130 and the insulating material 160 and/or between the second fuse pattern 140 and the insulating material 160.

The first air gap 170 is formed between the first fuse pattern 130 and the first portion 162 of the insulating material 160, and the second air gap 175 is formed between the second fuse pattern 140 and the first portion 162 of the insulating material 160. As such, the first air gap 170 is formed between the first fuse pattern 130 and the first spacer 190, and the second air gap 175 is formed between the second fuse pattern 140 and the second spacer 195.

A semiconductor device according to a further embodiment is described with reference to FIGS. 13 to 15.

Figure 13:
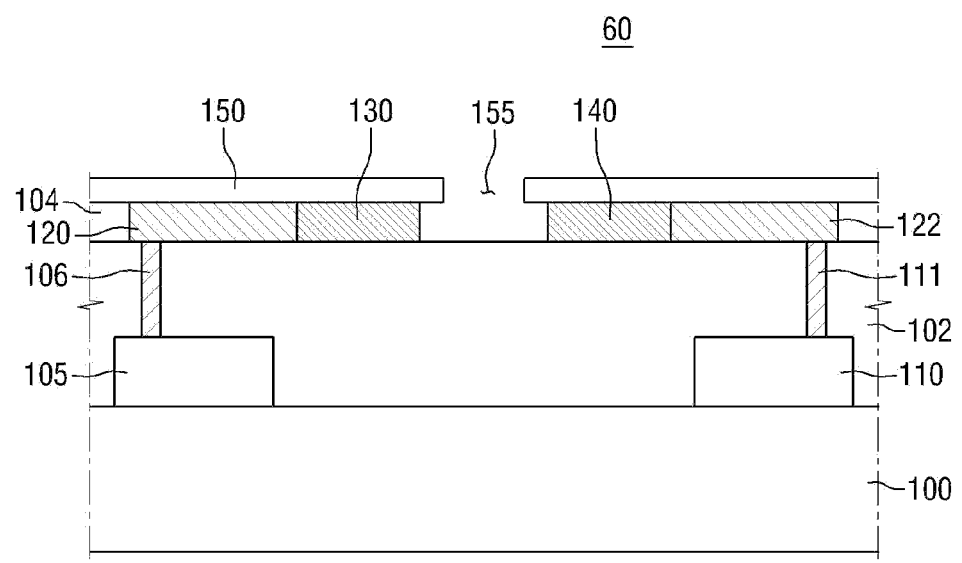
FIG. 13 is a view illustrating a semiconductor device according to another exemplary embodiment.
Figure 14:
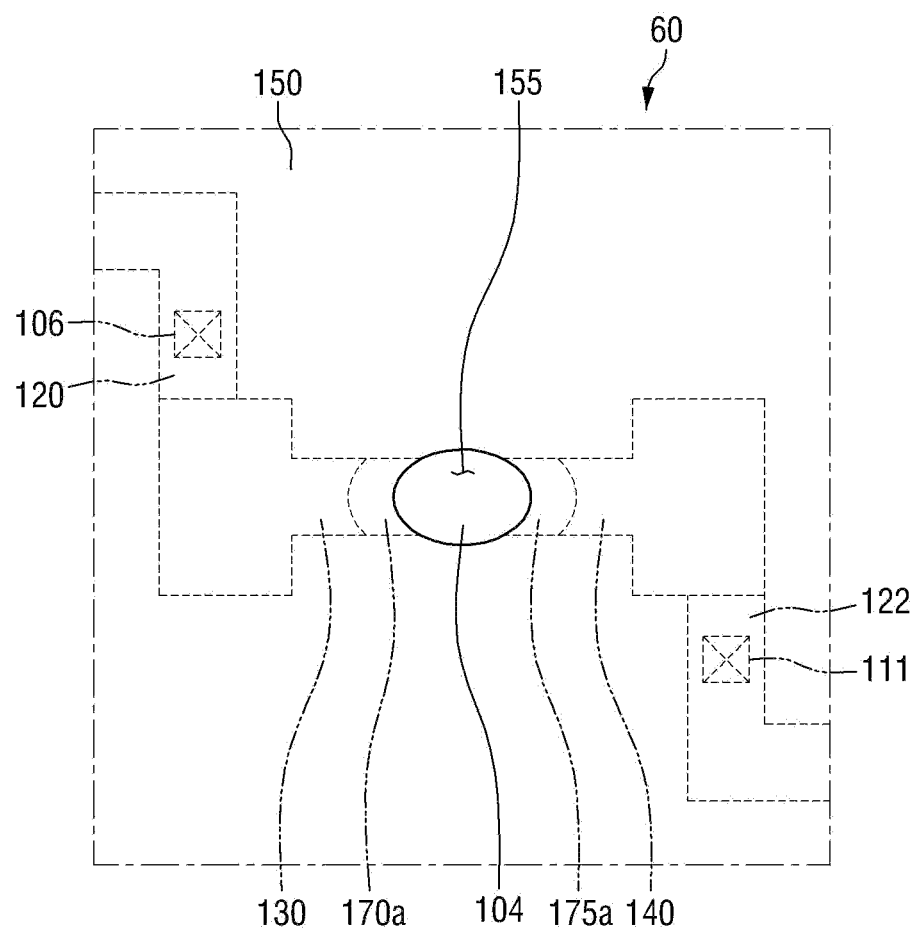
FIG. 14 is a plan view of FIG. 13, according to one exemplary embodiment.
Figure 15:
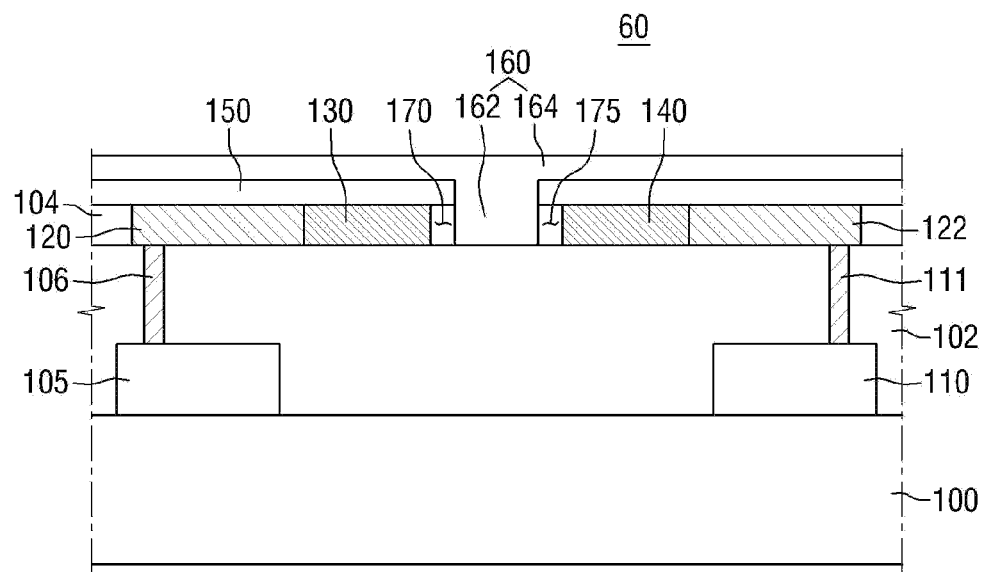
FIG. 15 is a view illustrating the semiconductor device shown in FIG. 13 after being assembled, according to one exemplary embodiment.

FIG. 13 is a view illustrating a semiconductor device according to an exemplary embodiment, FIG. 14 is a plan view of FIG. 13, and FIG. 15 is a view illustrating the semiconductor device shown in FIG. 13 after being assembled.

Referring to FIG. 13, a semiconductor device 60 includes a substrate 100, a first metal wiring 120, a second metal wiring 122, a first fuse pattern 130, a second fuse pattern 140 and a first insulation layer 150.

A first circuit pattern 105 and a second circuit pattern 110 may be formed on the substrate 100. A first metal wiring 120 and a second metal wiring 122 may be formed on the second insulation layer 102 and may be electrically connected to the first circuit pattern 105 and the second circuit pattern 110, respectively. In addition, the first fuse pattern 130 and the second fuse pattern 140 are formed on the second insulation layer 102 and are electrically connected to the first metal wiring 120 and the second metal wiring 122, respectively. As shown in FIG. 13, in one embodiment, the first metal wiring 120, the second metal wiring 122, the first fuse pattern 130 and the second fuse pattern 140 are all formed on the second insulation layer 102. In detail, the first metal wiring 120, the second metal wiring 122, the first fuse pattern 130 and the second fuse pattern 140 may be equally spaced apart (e.g., in a vertical direction) from the substrate 100 to then be formed on the second insulation layer 102, which is different from cases of the embodiments discussed previously. In those embodiments, the first and second fuse patterns 130 and 140 and the first and second metal wirings 120 and 122 are spaced different distances apart from the substrate 100. However, in the embodiment of FIG. 13, the first and second fuse patterns 130 and 140 and the first and second metal wirings 120 and 122 are equally spaced apart from the substrate 100.

The first insulation layer 150 is formed on the first and second metal wirings 120 and 122 and the first and second fuse patterns 130 and 140. The first insulation layer 150 includes an opening 155 formed between the first fuse pattern 130 and the second fuse pattern 140. Relationships between various functional components of the semiconductor device 60, the opening 155 and the fuse patterns 130 and 140 are substantially the same with those of the previous embodiments, and descriptions thereof will be omitted.

Referring to FIG. 14, the first fuse pattern 130 and the first metal wiring 120 are connected to each other, and the second fuse pattern 140 and the second metal wiring 122 are connected to each other. The opening 155 formed in the first insulation layer 150 is positioned between the first fuse pattern 130 and the second fuse pattern 140.

An undercut region 170a of the first fuse pattern 130 is positioned between the opening 155 and the first fuse pattern 130, and an undercut region 175a of the second fuse pattern 140 is positioned between the opening 155 and the second fuse pattern 140.

In the semiconductor device 60 according to the embodiment of FIG. 14, the first fuse pattern 130 is directly connected to the first metal wiring 120 and the second fuse pattern 140 is directly connected to the second metal wiring 122. However, the disclosure is not limited thereto.

Referring to FIG. 15, the semiconductor device 60 may further include an insulating material 160 having a first portion 162 and a second portion 164. The insulating material 160 is formed between the first fuse pattern 130 and the second fuse pattern 140. A first air gap 170 is formed between the first fuse pattern 130 and the insulating material 160, and a second air gap 175 is formed between the second fuse pattern 140 and the insulating material 160.

Figure 16:
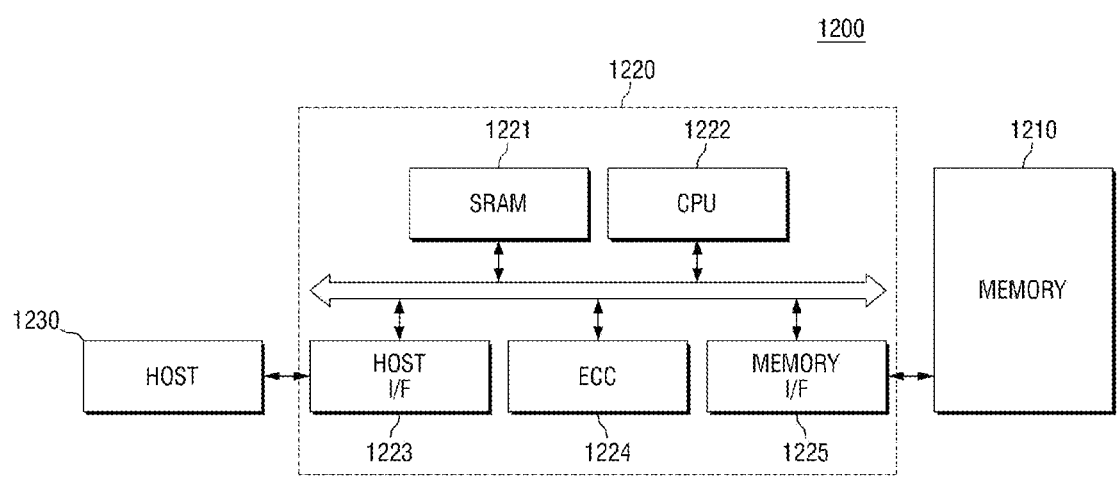
FIG. 16 is a block diagram illustrating one example of a memory card including semiconductor devices according to certain exemplary embodiments.

FIG. 16 is a block diagram illustrating one example of a memory card including semiconductor devices according to exemplary embodiments.

Referring to FIG. 16, a memory including semiconductor devices according to various exemplary embodiments may be employed in a memory card 1200. The memory card 1200 may include a memory controller 1220 for general data exchange between a host and the memory 1210.

The SRAM 1221 may be used as an operating memory of a central processing unit (CPU) 1222. A host interface (I/F) 1223 includes a data exchange protocol of a host connected to the memory card 1200. An error correction code (ECC) 1224 detects and corrects an error included in data read from the memory 1210. A memory interface (I/F) 1225 may interface with the memory 1210, which may employ one or more of the various embodiments described in connection with FIGS. 1-15. The CPU 1222 performs general control operations for data exchange of the memory controller 1220.

Figure 17:
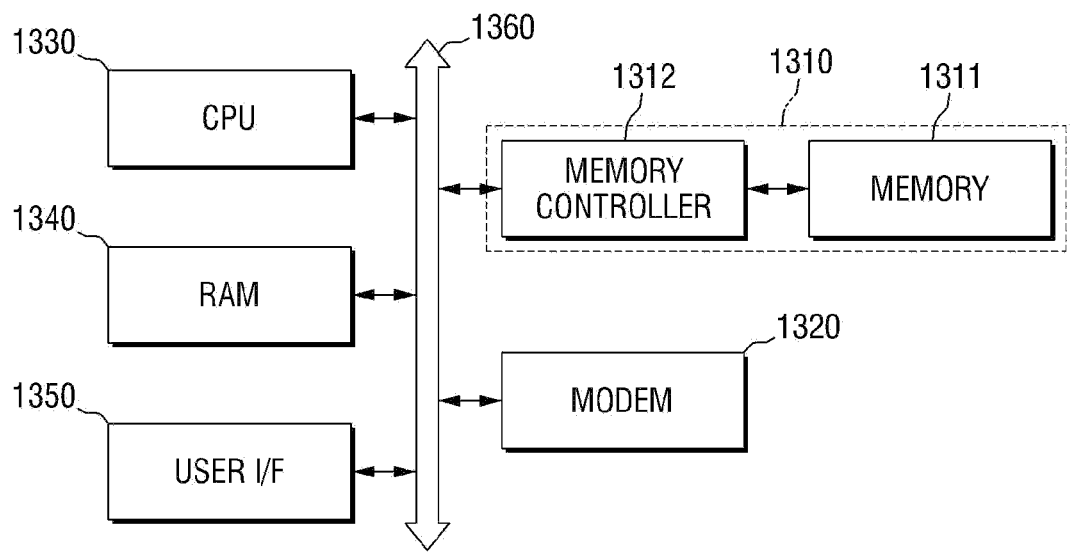
FIG. 17 is a block diagram illustrating an information processing system including semiconductor devices according to certain exemplary embodiments.

FIG. 17 is a block diagram illustrating an information processing system including semiconductor devices according to exemplary embodiments.

Referring to FIG. 17, the information processing system 1300 may include a memory system 1310 having semiconductor devices according to various embodiments described above. The information processing system 1300 may include a memory system 1310, a modem 1320 CPU 1330, RAM 1340, and a user interface 1350, electrically connected to a system bus 1360.

The memory system 1310 may include a memory 1311 and a memory controller 1312 and may have substantially the same configuration as the memory card 1200 shown in FIG. 16. The memory system 1310 stores data processed by the CPU 1330 or data inputted from the exterior. The information processing system 1300 may be applied to a memory card, SSD, a camera image processor (CIS), and other various application chipsets. For example, the memory system 1310 may be configured to be applied to SSD. In this case, the information processing system 1300 can stably and reliably store high capacity data.

Figure 18:
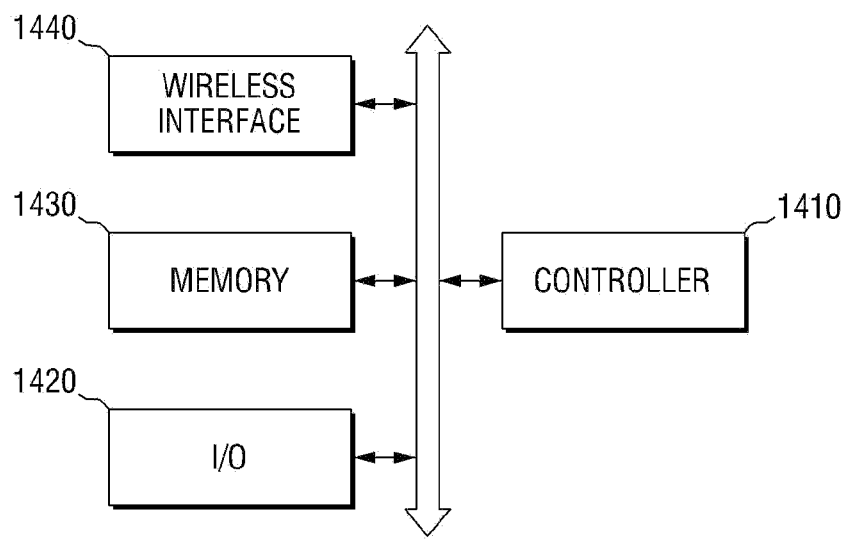
FIG. 18 is a block diagram of an electronic device including semiconductor devices according to certain exemplary embodiments.

FIG. 18 is a block diagram of an electronic device including semiconductor devices according to certain exemplary embodiments.

Referring to FIG. 18, an electronic device 1400 may include semiconductor devices according to various embodiments described above. The electronic device 1400 may be used in a wireless communication system (e.g., a personal digital assistant (PDA), a notebook computer, a portable computer, a web tablet, a wireless phone, or a digital music system) or various information transmitting/receiving systems in wireless communication surroundings.

The electronic device 1400 may include a controller 1410, an input/output (I/O) device 1420, a memory 1430, and a wireless interface 1440. Here, the memory 1430 may include semiconductor devices according to various embodiments described above. The controller 1410 may include a microprocessor, a digital signal processor, or the like. The memory 1430 may be used in storing commands (or user data) processed by the controller 1410. The wireless interface 1440 may be used in transmitting/receiving data through a wireless a communication network. The wireless interface 1440 may be coupled to the network via a wired or wireless coupling. For example, the wireless interface 1440 may include an antenna or a wired/wireless transceiver. The electronic device 1400 may use a communication interface protocol, for example, for third generation communication systems, e.g., Code Division Multiple Access (CDMA), Global System for Mobile Communications (GSM), North American Digital Cellular (NADC), Extended-Time Division Multiple Access (E-TDMA), Wideband Code Division Multiple Access (WCDMA), and CDMA2000.

While the present disclosure has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
   a substrate;
   a fuse including a first fuse pattern and a second fuse pattern formed at a same level on the substrate, the first fuse pattern and the second fuse pattern being spaced a first width apart from each other such that a gap in the fuse is disposed at a first location between the first fuse pattern and the second fuse pattern; and
   a first insulation layer formed on the first fuse pattern and the second fuse pattern, the first insulation layer including an opening above the first location and having a second width smaller than the first width.

2. The semiconductor device of claim 1, wherein the opening does not overlap either the first fuse pattern or the second fuse pattern.

3. The semiconductor device of claim 1, wherein the first fuse pattern and the second fuse pattern are electrically insulated from each other.

4. The semiconductor device of claim 1, further comprising an insulating material formed between the first fuse pattern and the second fuse pattern.

5. The semiconductor device of claim 4, further comprising an air gap formed between the first fuse pattern and the insulating material and/or between the second fuse pattern and the insulating material.

6. The semiconductor device of claim 5, wherein the air gap includes a first air gap and a second air gap, the first air gap formed between the first fuse pattern and the insulating material, and the second air gap formed between the second fuse pattern and the insulating material.

7. The semiconductor device of claim 1, further comprising a second insulation layer formed below the first fuse pattern and the second fuse pattern, wherein the second insulation layer includes a trench overlapping the opening.

8. The semiconductor device of claim 1, further comprising a conductive particle formed between the first fuse pattern and the second fuse pattern.

9. The semiconductor device of claim 8, further comprising an air gap formed between the first fuse pattern and the conductive particle and between the second fuse pattern and the conductive particle.

10. The semiconductor device of claim 8, wherein the conductive particle includes materials included in the first and second fuse patterns.

11. The semiconductor device of claim 1, further comprising a first spacer formed between the first fuse pattern and the opening.

12. The semiconductor device of claim 11, further comprising a second spacer formed between the second fuse pattern and the opening, wherein a first air gap is formed between the first spacer and the first fuse pattern.

13. The semiconductor device of claim 12, further comprising a second air gap formed between the second spacer and the second fuse pattern.

14. The semiconductor device of claim 1, wherein a conductive pattern is not formed immediately above the opening.

15. The semiconductor device of claim 1, further comprising first and second metal wirings formed under the first and second fuse patterns, respectively, the first metal wiring electrically connected to the first fuse pattern through a first via, and the second metal wiring electrically connected to the second fuse pattern through a second via.

16. The semiconductor device of claim 1, further comprising a first metal wiring electrically connected to the first fuse pattern and a second metal wiring electrically connected to the second fuse pattern, wherein the first fuse pattern, the second fuse pattern, the first metal wiring and the second metal wiring are equally spaced apart from the substrate.

17. The semiconductor device of claim 1, further comprising first and second circuit patterns formed below the first and second fuse patterns, respectively, the first fuse pattern electrically connected to the first circuit pattern and the second fuse pattern electrically connected to the second circuit pattern.

* * * * *